(12) United States Patent
Yang

(10) Patent No.: US 11,562,974 B2
(45) Date of Patent: Jan. 24, 2023

(54) HYBRID BONDING STRUCTURE AND METHOD OF FABRICATING THE SAME

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 102 days.

(21) Appl. No.: 17/160,332

(22) Filed: Jan. 27, 2021

(65) Prior Publication Data
US 2022/0216167 A1 Jul. 7, 2022

(30) Foreign Application Priority Data
Jan. 7, 2021 (CN) .......................... 202110017678.0

(51) Int. Cl.
*H01L 23/00* (2006.01)

(52) U.S. Cl.
CPC .............. *H01L 24/05* (2013.01); *H01L 24/03* (2013.01); *H01L 24/80* (2013.01); *H01L 2224/03831* (2013.01); *H01L 2224/05011* (2013.01); *H01L 2224/05026* (2013.01); *H01L 2224/80001* (2013.01)

(58) Field of Classification Search
CPC ......... H01L 24/05; H01L 24/03; H01L 24/80; H01L 2224/03831; H01L 2224/05011; H01L 2224/05026; H01L 2224/80001
See application file for complete search history.

(56) References Cited

U.S. PATENT DOCUMENTS

| | | | |
|---|---|---|---|
| 9,142,517 B2 * | 9/2015 | Liu | H01L 24/08 |
| 9,691,733 B1 * | 6/2017 | Shen | H01L 24/83 |
| 9,960,142 B2 * | 5/2018 | Chen | H01L 23/5226 |
| 11,107,775 B1 * | 8/2021 | Huang | H01L 23/552 |
| 11,158,573 B2 * | 10/2021 | Uzoh | H01L 23/298 |
| 2016/0126173 A1 * | 5/2016 | Kim | H01L 21/4853 257/738 |
| 2016/0284593 A1 * | 9/2016 | Yang | H01L 21/76802 |
| 2017/0069593 A1 * | 3/2017 | Chou | H01L 23/498 |
| 2019/0385982 A1 * | 12/2019 | Lee | H01L 24/08 |
| 2021/0028135 A1 * | 1/2021 | Said | H01L 24/80 |
| 2021/0320075 A1 * | 10/2021 | Hou | H01L 25/50 |
| 2021/0343668 A1 * | 11/2021 | Huang | H01L 23/3192 |
| 2022/0093448 A1 * | 3/2022 | Yu | H01L 21/76843 |

FOREIGN PATENT DOCUMENTS

CN 103094183 B * 7/2015
KR 20200052893 A * 10/2018 ............. H01L 24/03

* cited by examiner

Primary Examiner — Mamadou L Diallo
(74) Attorney, Agent, or Firm — Winston Hsu

(57) ABSTRACT

A hybrid bonding structure includes a first conductive structure and a second conductive structure. The first conductive structure includes a first conductive layer. A first barrier surrounds the first conductive layer. A first air gap surrounds and contacts the first barrier. A first dielectric layer surrounds and contacts the first air gap. The second conductive structure includes a second conductive layer. A second barrier contacts the second conductive layer. A second dielectric layer surrounds the second barrier. The second conductive layer bonds to the first conductive layer. The first dielectric layer bonds to the second dielectric layer.

20 Claims, 10 Drawing Sheets

US 11,562,974 B2

HYBRID BONDING STRUCTURE AND METHOD OF FABRICATING THE SAME

BACKGROUND OF THE INVENTION

1. Field of the Invention

The present invention relates to a hybrid boding structure, and more particularly to a hybrid boding structure which can avoid metal atoms diffusing into an interlayer dielectric when misalignment occurs.

2. Description of the Prior Art

Currently, the integration of electronic components has continued to increase. In one hand, the increase of the density of the electronic components comes from the continuous reduction of the minimum feature size, which enables more and smaller components to be integrated into a given area.

On the other hand, the use of stacked and bonded multi-layer wafers to form a three-dimensional (3D) integrated circuit is another way to increase the integration of electronic components. The wafers can be bonded by bonding two dielectric materials, bonding two metal materials or boding by a combination of the aforementioned two bonding methods.

However, there are still many problems to be dealt with for 3D integrated circuit technology. For example, when bonding two wafers, the misalignment of the wafers will cause the metal material to contact the interlayer dielectric and the metal atoms will diffuse into the interlayer dielectric and cause contamination.

SUMMARY OF THE INVENTION

According to a preferred embodiment of the present invention, a hybrid bonding structure includes a first conductive structure and a second conductive structure. The first conductive structure includes a first conductive layer, a first barrier surrounding and contacting the first conductive layer, a first air gap surrounding and contacting the first barrier and a first dielectric layer surrounding and contacting the first air gap. The second conductive structure includes a second conductive layer, a second barrier contacting the second conductive layer and a second dielectric layer surrounding the second barrier. The second conductive layer contacts and bonds to the first conductive layer, and the first dielectric layer contacts and bonds to the second dielectric layer.

According to a preferred embodiment of the present invention, a fabricating method of a hybrid bonding structure includes performing an air gap fabricating method including steps of forming a first dielectric layer. Later, an etching stop layer is formed to cover the first dielectric layer. Next, a second dielectric layer is formed to cover the etching stop layer. Subsequently, a trench within the second dielectric layer and the etching stop layer is formed. After that, a first barrier and a first conductive layer are formed to fill in the trench in sequence. Later, a patterned mask is formed to cover the second dielectric layer, wherein the first barrier, the first conductive layer and the second dielectric layer which is around the first barrier are exposed through the patterned mask. Next, an etching step is performed to remove the second dielectric layer exposed through the patterned mask to form an air gap surrounding the first barrier. Finally, the patterned mask is removed to form an $N^{th}$ conductive structure, wherein N is a positive integer from 1 to 2.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5A depict an air gap fabricating method according to a first preferred embodiment of the present invention, wherein:

FIG. 1 depicts a stage of providing a second dielectric layer.

FIG. 2 is a fabricating stage following FIG. 1;
FIG. 3 is a fabricating stage following FIG. 2;
FIG. 4 is a fabricating stage following FIG. 3;
and
FIG. 5A is a fabricating stage following FIG. 4.
FIG. 7 to FIG. 10 depict an air gap fabricating method according to a second preferred embodiment of the present invention, wherein:
FIG. 7 depicts a stage of providing a first dielectric layer;
FIG. 8 is a fabricating stage following FIG. 7;
FIG. 9 is a fabricating stage following FIG. 8;
and
FIG. 10 is a fabricating stage following FIG. 9.

DETAILED DESCRIPTION

Figure 1:
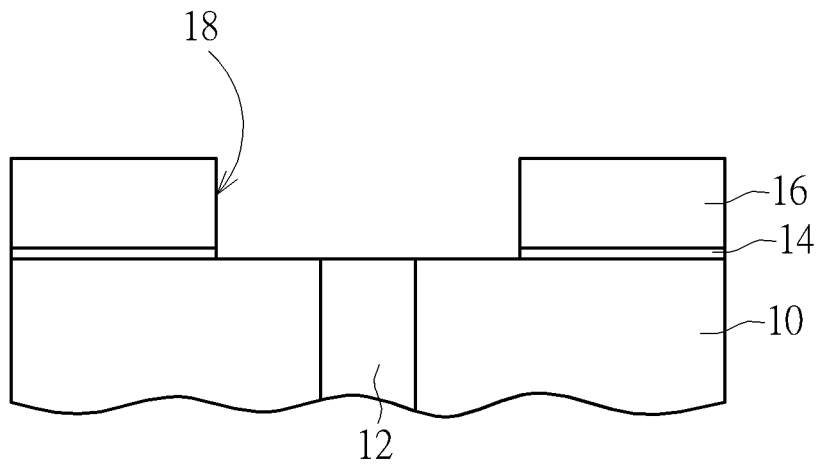

FIG. 1 to FIG. 5A depict an air gap fabricating method according to a first preferred embodiment of the present invention. FIG. 5B depicts a varied type of an air gap fabricating method according to the first preferred embodiment of the present invention. FIG. 5C depicts another varied type of an air gap fabricating method according to the first preferred embodiment of the present invention. As shown in FIG. 1, a first dielectric layer 10 is provided. The first dielectric layer 10 can be disposed on a substrate (not shown). Numerous interlayer dielectrics are disposed on the substrate, and metal interconnections are formed within the interlayer dielectrics. The substrate can be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. Moreover, the substrate can be a wafer which is not diced, a circuit board, an interposer, or a die which is to be packaged. A metal layer 12 such as a contact plug is disposed within the first dielectric layer 10. Later, an etching stop layer 14 is formed to cover the first dielectric layer 10. The etching stop layer 14 includes SiC or SiCN. A thickness of the etching stop layer 14 is preferably between 1 nm to 500 nm.

Subsequently, a second dielectric layer 16 is formed to cover the etching stop layer 14. Next, the second dielectric layer 16 and the etching stop layer 14 are etched to form a trench 18 within the second dielectric layer 16 and the etching stop layer 14. Now, the metal layer 12 is exposed through the trench 18.

Figure 2:
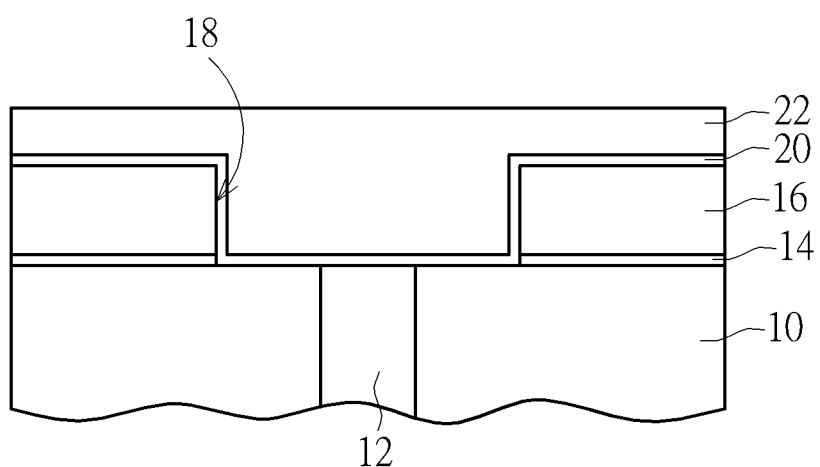

As shown in FIG. 2, a first barrier 20 and a first conductive layer 22 are formed to fill into the trench 18 in sequence. The first barrier 20 conformally covers the second dielectric layer 16 and the trench 18. The first conductive layer 22 covers the first barrier 20. The first barrier 20 includes TiN, TaN or Ti/TiN, but not limited to these materials. Other conductive materials which can block metal diffusion can serve as the first barrier 20. A thickness of the first barrier 20 is preferably between 1 nm and 100 nm. The first barrier 20 is preferably formed by a deposition process. The first conductive layer 22 incudes Cu, Al, W, Ti, TiN, Ta, Cu/Al, TaN or a combination thereof. According to the first preferred embodiment, a thickness of the first conductive layer 22 is between 1 nm and 5000 nm, the first conductive layer 22 is Cu and the first conductive layer 22 is formed by electroplating.

Figure 3:
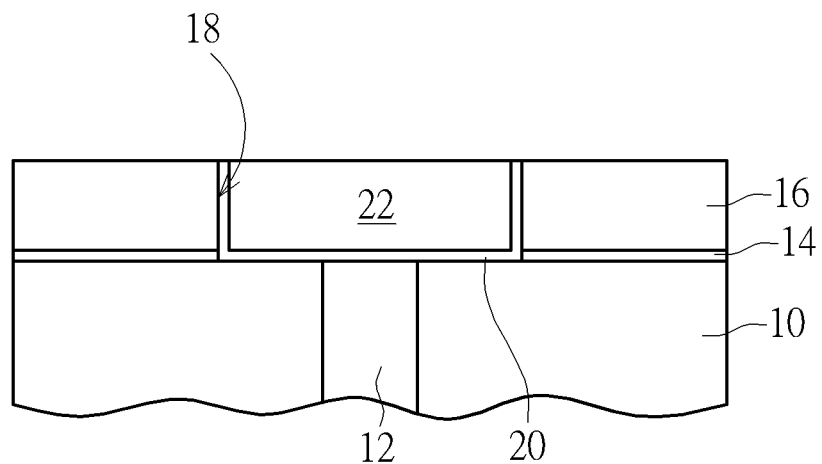
Figure 4:
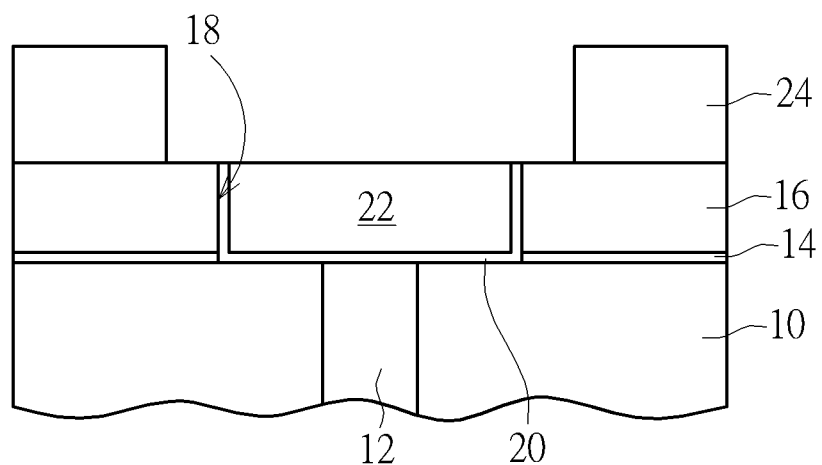

As shown in FIG. 3, a chemical mechanical planarization (CMP) is performed to remove the first conductive layer 22 and the first barrier 20 outside of the trench 18. As shown in FIG. 4, a patterned mask 24 is formed to cover the second dielectric layer 16 to define a position of an air gap. The first barrier 20, the first conductive layer 22 and the second dielectric layer 16 which is around the first barrier 20 are exposed through the patterned mask 24. The patterned mask 24 is preferably a photoresist.

Figure 5A:
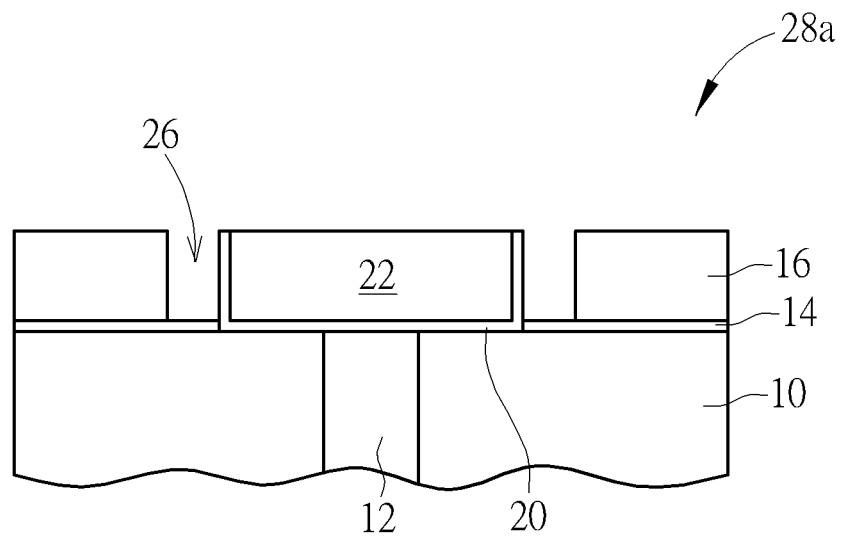
Figure 5B:
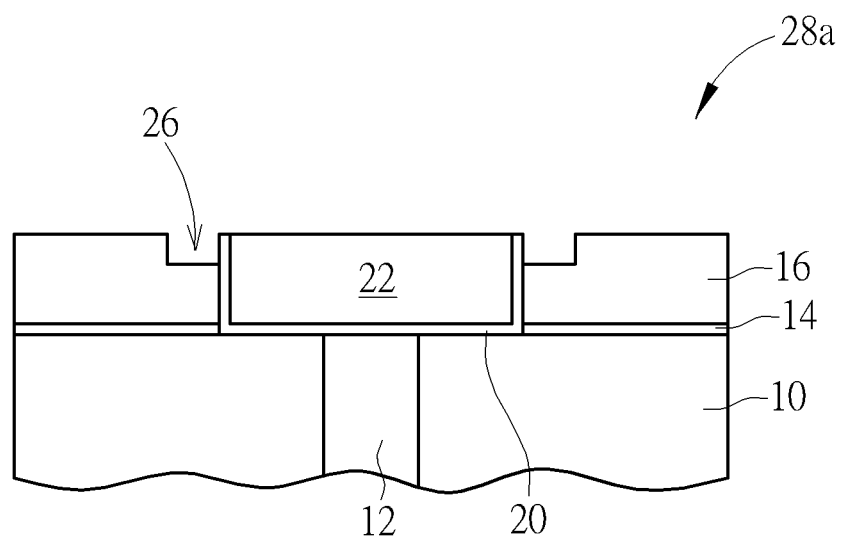
FIG. 5B depicts a varied type of an air gap fabricating method according to the first preferred embodiment of the present invention.
Figure 5C:
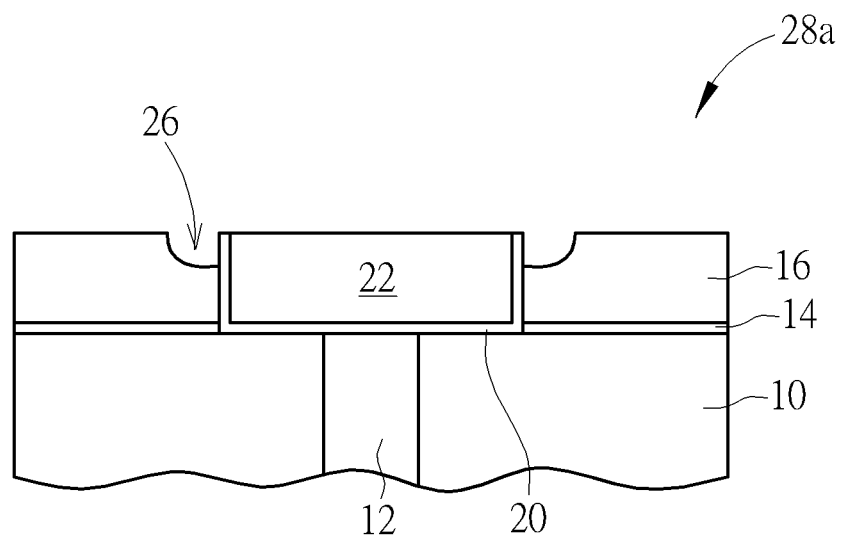
FIG. 5C depicts another varied type of an air gap fabricating method according to the first preferred embodiment of the present invention.
Figure 6:
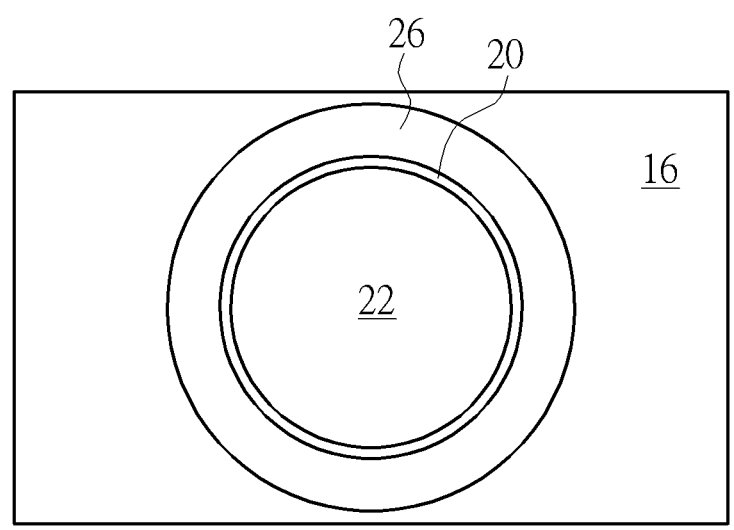
FIG. 6 schematically depicts a top view of FIG. 5A, FIG. 5B and FIG. 5C.

Please refer to FIG. 5A, FIG. 5B, FIG. 5C and FIG. 6, wherein FIG. 6 depicts a top view of FIG. 5A, FIG. 5B and FIG. 5C schematically. First, an etching step is performed by taking the patterned mask 24 as a mask to remove the second dielectric layer 16 exposed through the patterned mask 24 to form an air gap 26 surrounding the first barrier 20. After the air gap 26 is formed, the patterned mask 24 is removed. Based on different product requirements, the etching step may be a dry etching, a partial dry etching or a wet etching. FIG. 5A depicts an example of performing a dry etching as an etching step. More specifically speaking, in FIG. 5A, the second dielectric layer 16 is removed by a dry etching until the etching stop layer 14 is exposed. FIG. 5B depicts an example of performing a partial dry etching as an etching step. As shown in FIG. 5B, a thickness of the second dielectric layer 16 is only removed partly, and the etching stop layer 14 is not exposed. FIG. 5C depicts an example of performing a wet etching as an etching step. As shown in FIG. 5C, after the second dielectric layer 16 is removed by the wet etching, an arc-shaped profile is formed on the surface of the second dielectric layer 16. In this embodiment, the wet etching is stopped before reaching the etching stop layer 14. However, based on different requirements, the wet etching can be performed continuously until reaching the etching stop layer 14. During the dry etching, the partial dry etching or the wet etching, the etchant only removed the second dielectric layer 16. After the air gap 26 is formed, the patterned mask 24 is removed. Now, the air gap fabricating method of the present invention is completed and a first conductive structure 28a is formed. Later, another substrate can be provided and the air gap fabricating method in the first preferred embodiment can be repeated to the substrate to form a second conductive structure. The second conductive structure can be formed by a dry etching, a partial dry etching or a wet etching; therefore, a structure of the second conductive structure can be one of the structures shown in FIG. 5A, FIG. 5B or FIG. 5C. Similarly, the second conductive structure can be formed on a wafer which is not diced, a circuit board, an interposer, or a die which is to be packaged.

FIG. 7 to FIG. 10 depict an air gap fabricating method according to a second preferred embodiment of the present invention, wherein elements in the second preferred embodiment which are substantially the same as those in the first preferred embodiment are denoted by the same reference numerals; an accompanying explanation is therefore omitted.

Figure 7:
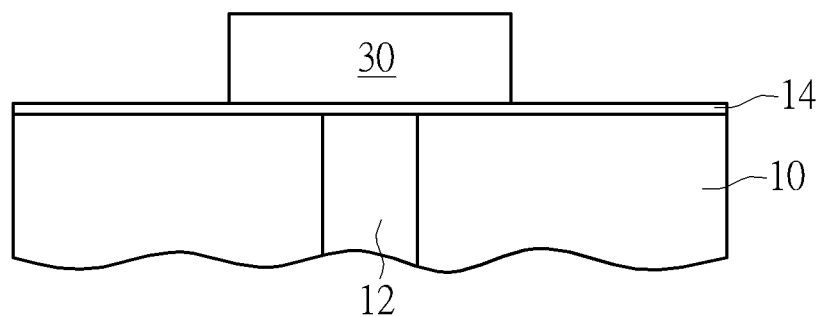

As shown in FIG. 7, a first dielectric layer 10 is provided. A metal layer 12 is disposed within the first dielectric layer 10. Later, an etching stop layer 14 is formed to cover the first dielectric layer 10. Later, a sacrifice layer 30 is formed to cover part of the etching stop layer 14. At least part of the sacrifice layer 30 overlaps the metal layer 12. The sacrifice layer 30 is preferably a silicon-containing material such as polysilicon.

Figure 8:
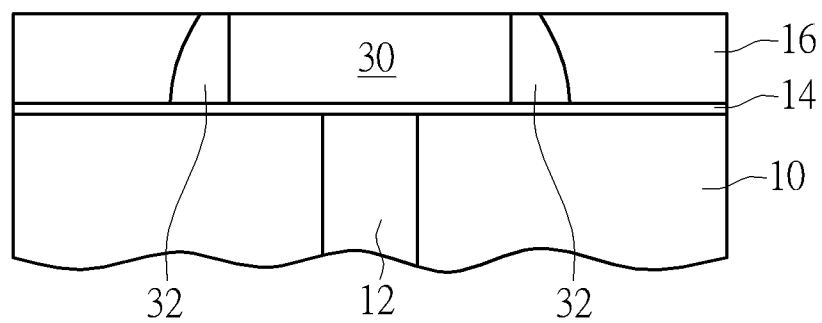
Figure 9:
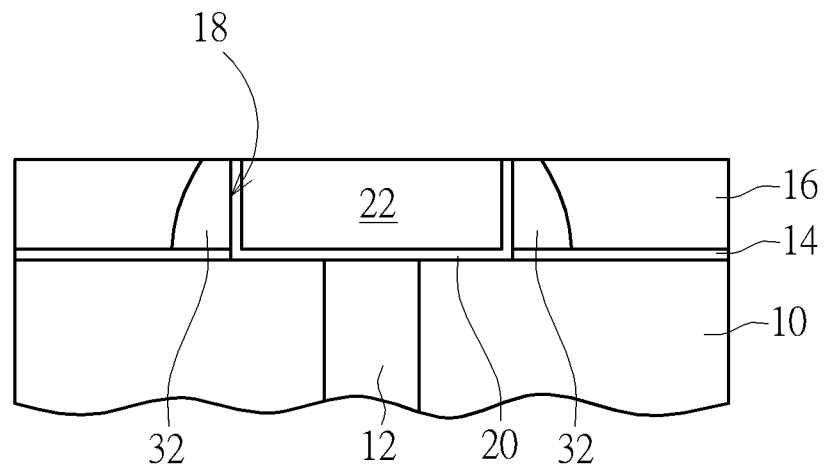
Figure 10:
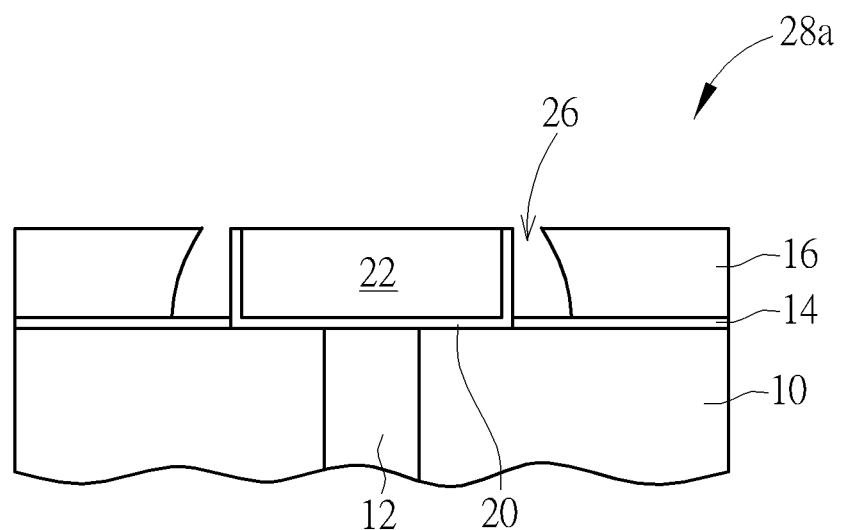

As shown in FIG. 8, a spacer 32 is formed to surround the sacrifice layer 30. Next, a second dielectric layer 16 is formed to cover the etching stop layer 14, wherein a top surface of the second dielectric layer 16 is aligned with a top surface of the sacrifice layer 30. The spacer 32 will become an air gap in the following steps; therefore a thickness of the air gap can be adjusted by altering a thickness of the spacer 32. As shown in FIG. 9, the sacrifice layer 30 and the etching stop layer 14 directly below the sacrifice layer 30 are removed to form a trench 18. Next, a first barrier 20 and a first conductive layer 22 are formed to fill in the trench 18 in sequence, and the first barrier 18 and the first conductive layer 22 outside of the trench 18 are removed. As shown in FIG. 10 and FIG. 6, the spacer 32 is removed to form an air gap 26 surrounding the first barrier 20. Now, the air gap fabricating method is completed, and a first conductive structure 28a is formed. Later, another substrate can be provided and the air gap fabricating method in the second preferred embodiment can be repeated to the substrate to form a second conductive structure.

Figure 11A:
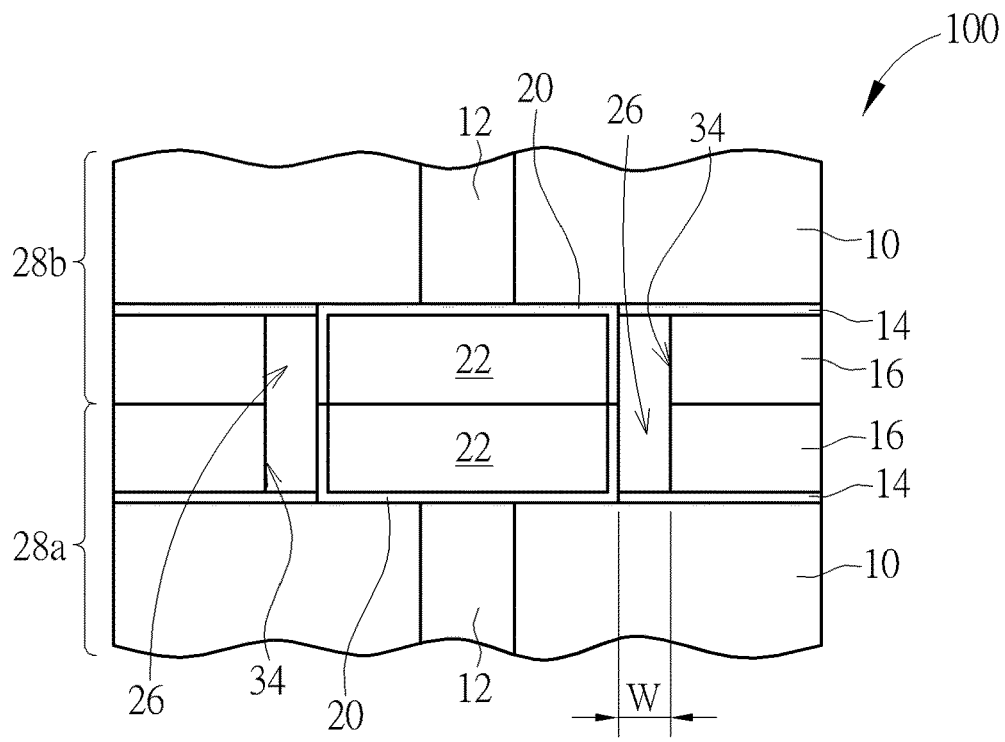
FIG. 11A depicts a fabricating method of a hybrid bonding structure according to a preferred embodiment of the present invention.

FIG. 11A depicts a fabricating method of a hybrid bonding structure according to a preferred embodiment of the present invention, wherein elements which are substantially the same as those in the first preferred embodiment are denoted by the same reference numerals; an accompanying explanation is therefore omitted.

As shown in FIG. 11A, after forming a first conductive structure 28a and a second conductive structure 28b by using an air gap fabricating method illustrated in the first preferred embodiment, the first conductive layer 22 of the first conductive structure 28a is bonded to the first conductive layer 22 of the second conductive structure 28b, and the second dielectric layer 16 of the first conductive structure 28a is bonded to the second dielectric layer 16 of the second conductive structure 28b. For example, if the first conductive structure 28a is on a wafer which is not diced and the second conductive structure 28b is on another wafer which is not diced, this hybrid bonding is a wafer to wafer bonding, but not limited to this. The hybrid bonding can also be a die to die bonding or a wafer to interposer bonding. At this point, a hybrid bonding structure 100 of the present invention is completed. In this embodiment, the air gaps 26 within the first conductive structure 28a and the second conductive structure 28b are formed by a dry etching.

The hybrid bonding structure of the present invention can be formed by bonding two conductive structures to each other. The two conductive structures can be formed by using the method in the first preferred embodiment or the second preferred embodiment. In other way, the hybrid bonding structure of the present invention can be formed by bonding a conductive structure without any air gap to a conductive structure formed by using the first preferred embodiment or the second preferred embodiment. As long as one of the two conductive structures in the hybrid bonding structure has an air gap. In this way, besides the above-mentioned hybrid bonding structure 100, numerous varied types of hybrid bonding structures can also be formed by the fabricating method of the present invention. In FIG. 11B, FIG. 11C, FIG. 11D, FIG. 11E, FIG. 11F and FIG. 11G depict numerous varied types of hybrid bonding structures of the present invention, but not limited to these varied types, any hybrid bonding structure which has a conductive structure with an air gap is in the scope of the present invention. Similarly, the hybrid bonding structures in FIG. 11B, FIG. 11C, FIG. 11D, FIG. 11E, FIG. 11F and FIG. 11G can be formed by a wafer to wafer bonding, a die to die boding or a wafer to interposer bonding.

Figure 11B:
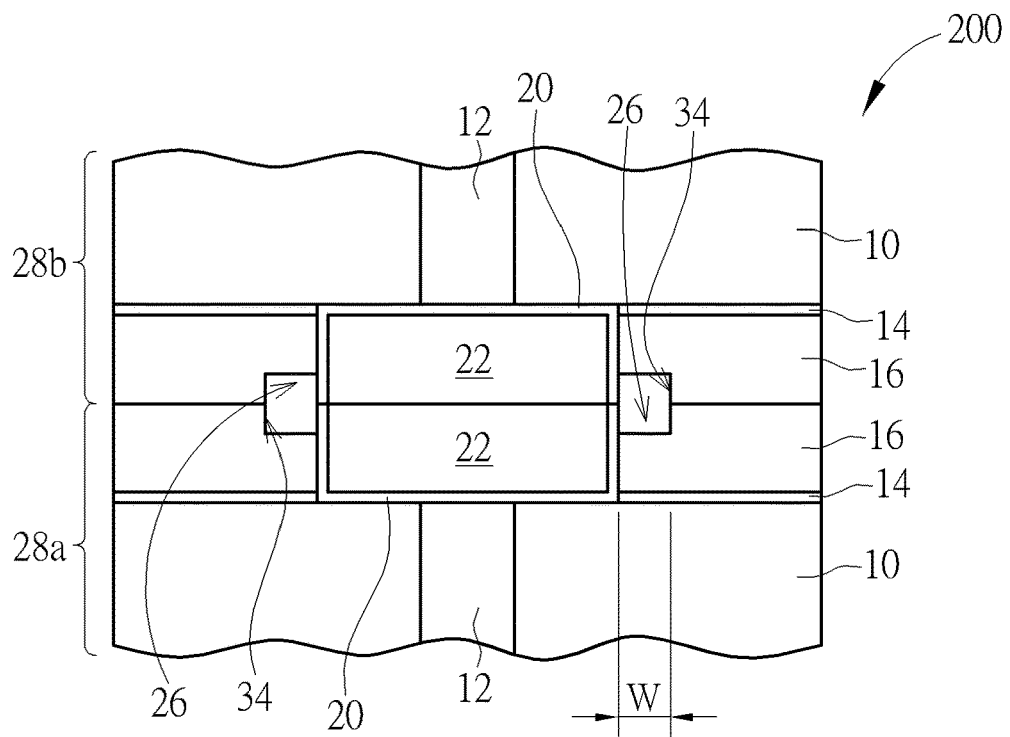
FIG. 11B, FIG. 11C, FIG. 11D, FIG. 11E, FIG. 11F and FIG. 11G depict numerous varied types of hybrid bonding structures according to the present invention.

As shown in FIG. 11B, after forming a first conductive structure 28a and a second conductive structure 28b by a partial dry etching illustrated in the first preferred embodiment, the first conductive layer 22 of the first conductive structure 28a bonds to the first conductive layer 22 of the second conductive structure 28b, and the second dielectric layer 16 of the first conductive structure 28a bonds to the second dielectric layer 16 of the second conductive structure 28b to form a hybrid bonding structure 200.

Figure 11C:
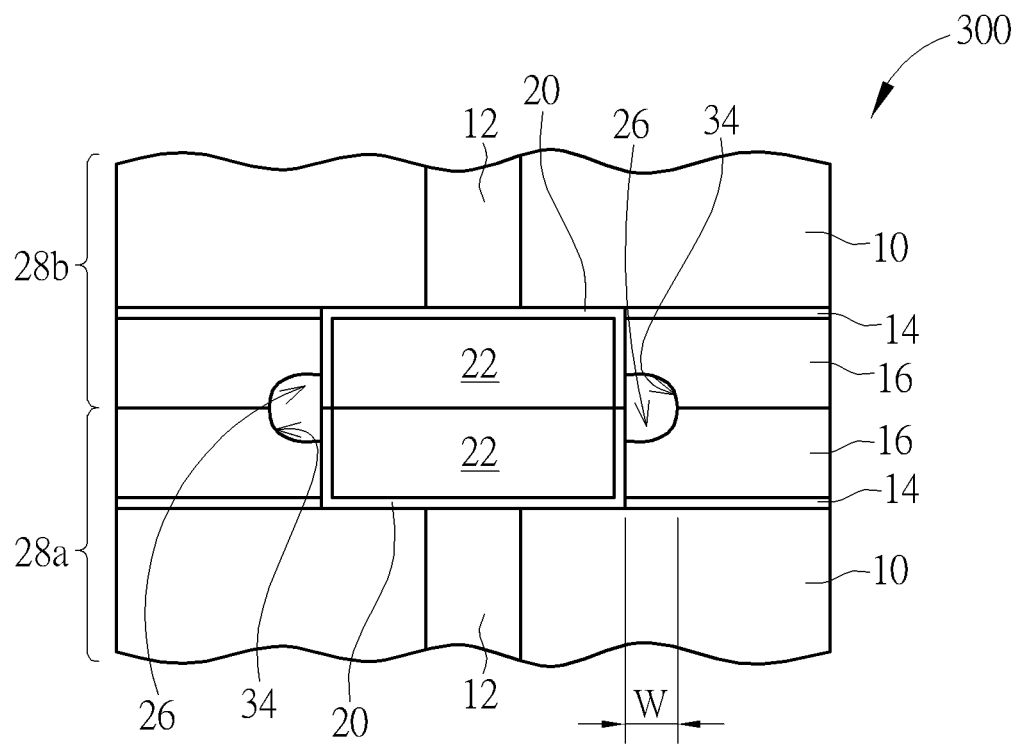

As shown in FIG. 11C, after forming a first conductive structure 28a and a second conductive structure 28b by a wet etching illustrated in the first preferred embodiment, the first conductive layer 22 of the first conductive structure 28a bonds to the first conductive layer 22 of the second conductive structure 28b, and the second dielectric layer 16 of the first conductive structure 28a bonds to the second dielectric layer 16 of the second conductive structure 28b to form a hybrid bonding structure 300.

As shown in FIG. 11C, a first conductive structure 28a and a third conductive structure 28c are provided. The first conductive structure 28a is provided by using the air gap fabricating process illustrated in the first preferred embodiment. The third conductive structure 28c includes a second conductive layer 122, a second barrier 120 contacting the second conductive layer 122, a third dielectric layer 116 contacting the second barrier 120. In other words, there is no air gap within the third conductive structure 28c. In addition, a fourth dielectric layer 110 is disposed under the third dielectric layer 116. A metal layer 112 is disposed within the fourth dielectric layer 110, and the metal layer 112 overlaps the second conductive layer 122. An etching stop layer 114 is between the fourth dielectric layer 110 and the third dielectric layer 116. Later, the first conductive layer 22 of the first conductive structure 28a bonds to the second conductive layer 122 of the third conductive structure 28c. The second dielectric layer 16 of the first conductive structure 22a bonds to the third dielectric layer 116 of the third conductive structure 28c to form a hybrid bonding structure 400. Although this varied type is exemplified by the first conductive structure 28a formed by a dry etching, however, the first conductive structure 28a formed by a partial etching (FIG. 5B), and the first conductive structure 28a formed by a wet etching (FIG. 5C) can also be applied in this varied type.

Figure 11D:
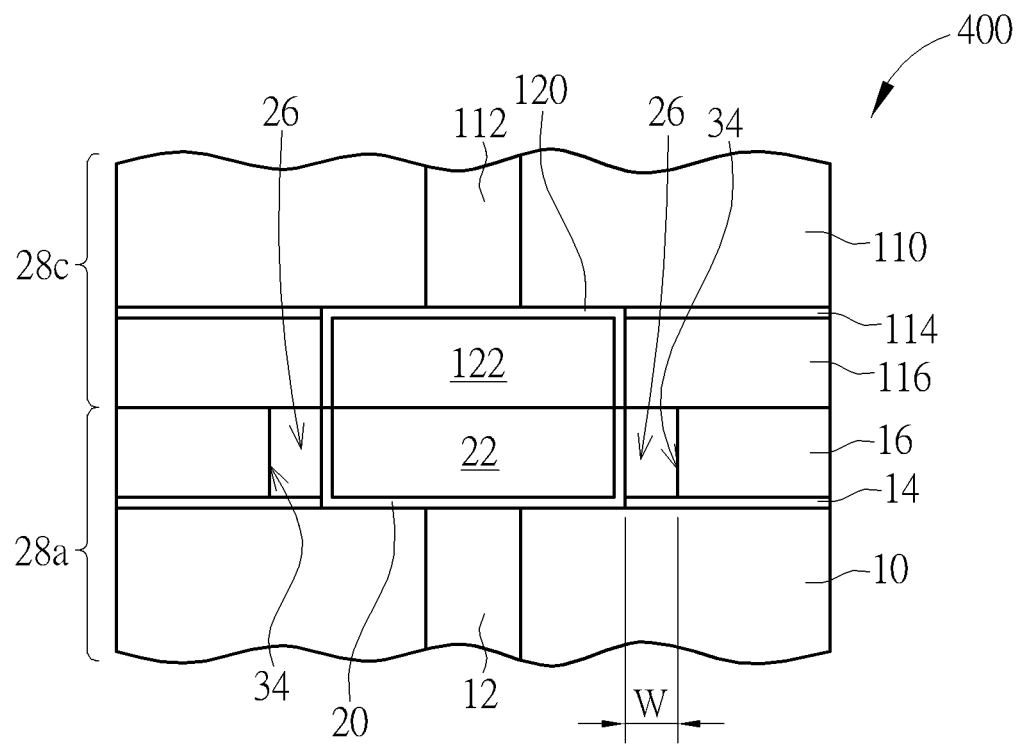
Figure 11E:
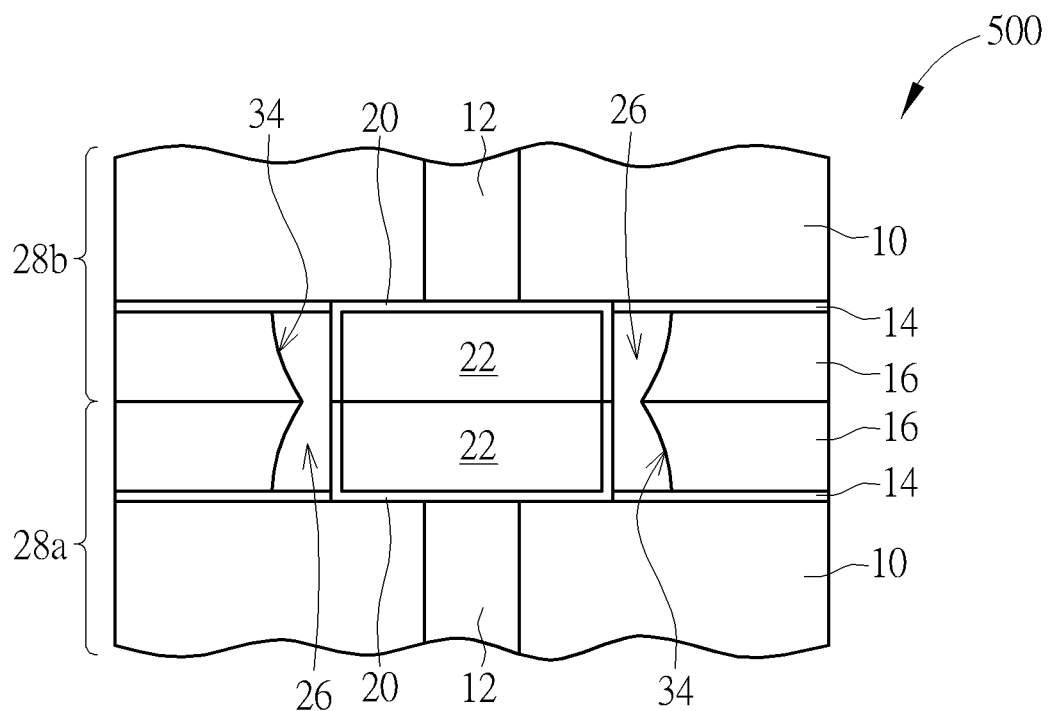

As shown in FIG. 11E, after forming a first conductive structure 28a and a second conductive structure 28b by using an air gap fabricating method illustrated in the second preferred embodiment, the first conductive layer 22 of the first conductive structure 28a bonds to the first conductive layer 22 of the second conductive structure 28b, and the second dielectric layer 16 of the first conductive structure 28a bonds to the second dielectric layer 16 of the second conductive structure 28b to forma hybrid bonding structure 500.

Figure 11F:
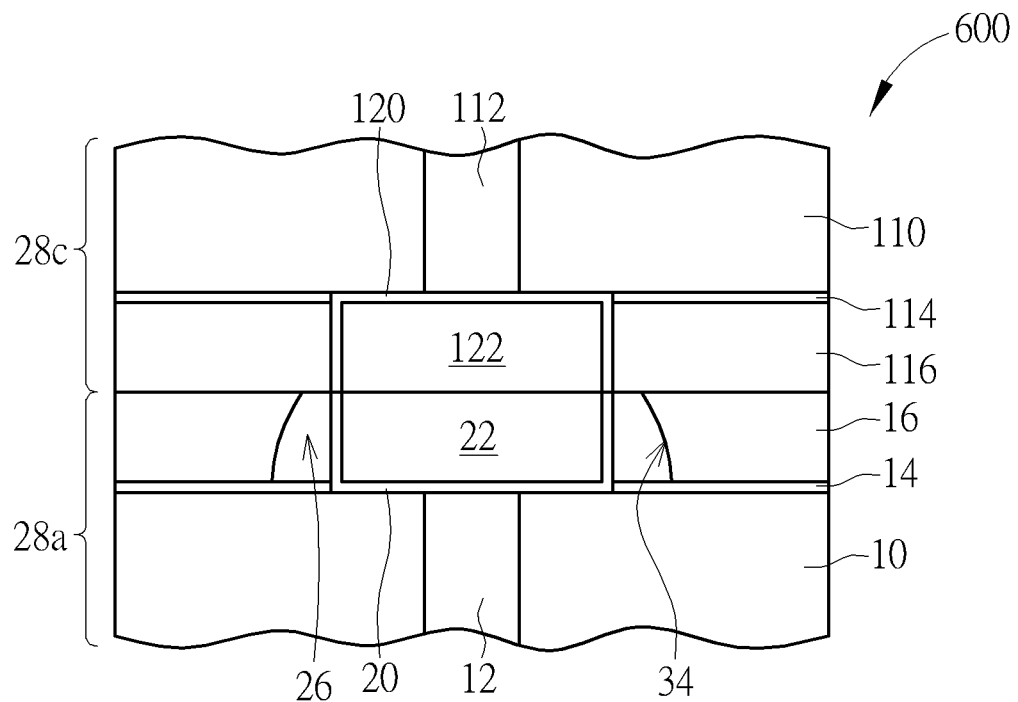

As shown in FIG. 11F, after forming a first conductive structure 28a by using an air gap fabricating method illustrated in the second preferred embodiment, a third conductive structure 28c is provided. The detail structure of the third conductive structure 28c is mentioned above; an accompanying explanation is therefore omitted. Later, the first conductive layer 22 of the first conductive structure 28a bonds to the second conductive layer 122 of the third conductive structure 28c. The second dielectric layer 16 of the first conductive structure 22a bonds to the third dielectric layer 116 of the third conductive structure 28c to form a hybrid bonding structure 600.

Figure 11G:
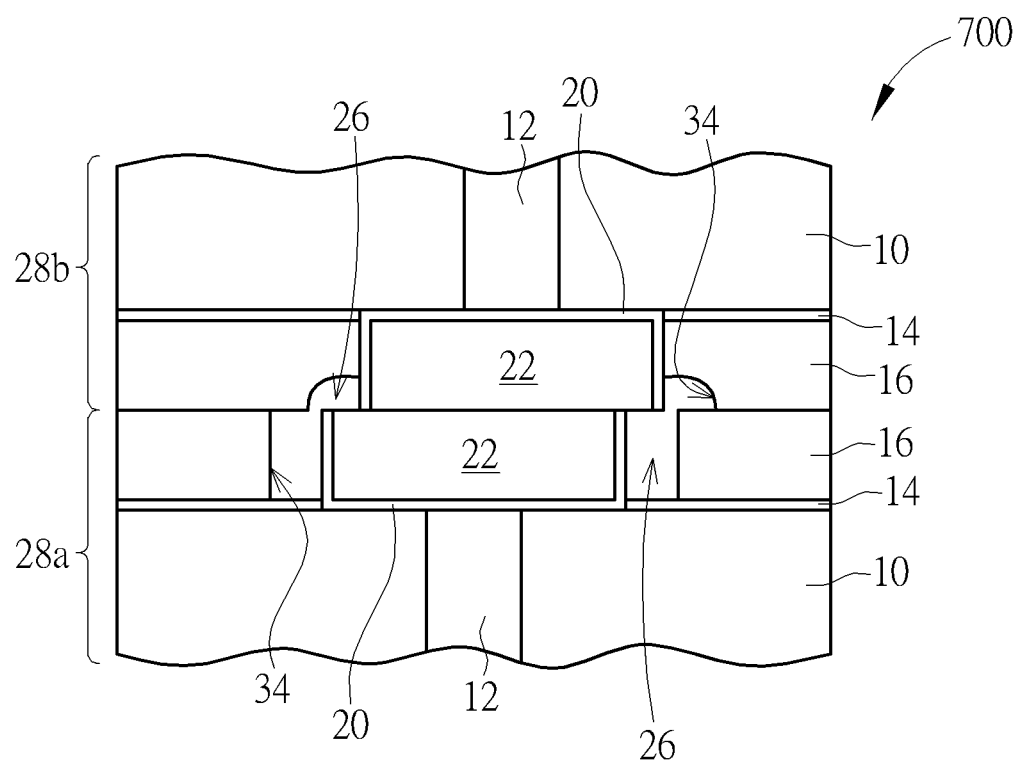

As shown in FIG. 11G, after forming a first conductive structure 28a and a second conductive structure 28b by using a dry etching illustrated in the first preferred embodiment, the first conductive layer 22 of the first conductive structure 28a bonds to the first conductive layer 22 of the second conductive structure 28b, and the second dielectric layer 16 of the first conductive structure 28a bonds to the second dielectric layer 16 of the second conductive structure 28b to form a hybrid bonding structure 700. It is noteworthy that misalignment occurred during bonding the second conductive structure 28b and the first conductive structure 28a. Therefore, part of the first conductive layer 22 of the first conductive structure 28a is not attached on the first conductive layer 22 of the second conductive structure 28b, and the part of the first conductive layer 22 of the first conductive structure 28a contacts the air gap 26. However, the metal atoms in the first conductive layer 22 can't diffuse through the air gap 26; therefore, the contamination from diffusion of the metal atoms can be prevented.

FIG. 11A, FIG. 11B, FIG. 11C, FIG. 11D, FIG. 11E, FIG. 11F and FIG. 11G respectively depict a hybrid bonding structure according to a preferred embodiment of the present invention, wherein elements which are substantially the same as those in the first preferred embodiment are denoted by the same reference numerals; an accompanying explanation is therefore omitted.

As shown in FIG. 11A, a hybrid bonding structure 100 includes a first conductive structure 28a and a second conductive structure 28b. The top view of the first conductive structure 28a and the second conductive structure 28b are the same and are shown in FIG. 6. Please refer to FIG. 6 and FIG. 11A. The first conductive structure 28a and the second conductive structure 28b respectively include a first conductive layer 22, a first barrier 20 surrounding and contacting the first conductive layer 22, an air gap 26 surrounding and contacting the first barrier 20 and a second dielectric layer 16 surrounding and contacting the air gap 26. The top surface of the second dielectric layer 16 is aligned with the top surface of the first conductive layer 22. The first conductive layer 22 of the first conductive structure 28a bonds to and is attached on the first conductive layer 22 of the second conductive structure 28b, and the second dielectric layer 16 of the first conductive structure 28a bonds to and is attached the second dielectric layer 16 of the second conductive structure 28b. A depth of the air gap 26 is the same as a depth of the second dielectric layer. An etching stop layer 14 is exposed through the air gaps 26. Moreover, a width W of the air gap 26 is between 0.01 μm and 10 μm. The air gap 26 forms a recess 34 within the second dielectric layer 16. A bottom of the recess 34 is a horizontal surface. A sidewall of the recess 34 is a vertical sidewall. A width of the bottom of the recess 34 is the same as a width of the opening of the recess 34.

A first dielectric layer 10 is disposed below the second dielectric layer 16 in the first conductive structure 28a and below the second dielectric layer 16 in the second conductive structure 28b. A metal layer 12 such as a metal plug is disposed within the first dielectric layer 10. An etching stop layer 14 is disposed between the first dielectric layer 10 and the second dielectric layer 16. The etching stop layer 14 includes SiC or SiCN. A thickness of the etching stop layer 14 is preferably between 1 nm and 500 nm.

The first dielectric layer 10 and the second dielectric layer respectively includes silicon oxide, silicon oxynitride, phosphosilicate glass, borophosphosilicate, fluorinated silicate glass, organosilicate glasses, silicon oxycarbide, spin on glass, spin on polymer, silicon carbide or a combination thereof. A thickness of the second dielectric layer 16 is preferably between 1 nm and 5000 nm. The first barrier 20 includes TiN, TaN or Ti/TiN. A thickness of the first barrier 20 is preferably between 1 nm and 100 nm. The first conductive layer 22 incudes Cu, Al, W, Ti, TiN, Ta, Cu/Al, TaN or a combination thereof. According to this embodiment, a thickness of the first conductive layer 22 is between 1 nm and 5000 nm. Moreover, the air gap 26 can be filled up with air, oxygen, nitrogen or inert gas.

As shown in 11B, a hybrid bonding structure 200 is formed by bonding the first conductive layer 28a to the second conductive layer 28b. The first conductive layer 28a and the second conductive layer 28b have the same structure. The difference between the hybrid bonding structure 100 and the hybrid bonding structure 200 is that a depth of the air gap 26 of the hybrid bonding structure 200 is smaller than a depth of the second dielectric layer 16. Other elements are the same as that of the hybrid bonding structure 100 and therefore are omitted.

As shown in FIG. 11C, a hybrid bonding structure 300 is formed by bonding the first conductive layer 28a to the second conductive layer 28b. The first conductive layer 28a and the second conductive layer 28b have the same structure. The difference between the hybrid bonding structure 300 and the hybrid bonding structure 100 is that the air gap 26 of the hybrid bonding structure 300 forms a recess 34 within the second dielectric layer 16. A bottom of the recess 34 is arc-shaped. Other elements are the same as that of the hybrid bonding structure 100 and therefore are omitted.

As shown in FIG. 11D, a hybrid bonding structure 400 is formed by bonding the first conductive layer 28a to the third conductive layer 28c. The difference between the hybrid bonding structure 400 and the hybrid bonding structure 100 is that there is no air gap within the third conductive layer 28c. In details, the third conductive structure 28c includes a second conductive layer 122, a second barrier 120 contacting the second conductive layer 122, a third dielectric layer 116 contacting the second barrier 120. The first conductive layer 22 bonds to the second conductive layer 122. The second dielectric layer 16 bonds to the third dielectric layer 116. The second conductive layer incudes Cu, Al, W, Ti, TiN, Ta, Cu/Al, TaN or a combination thereof. A thickness of the second conductive layer 122 is preferably between 1 nm and 5000 nm. The second barrier 120 includes TiN, TaN or Ti/TiN. A thickness of the second barrier 120 is preferably between 1 nm and 100 nm. The third dielectric layer 116 can be selected from the same material group as that of the second dielectric layer 16. Other elements are the same as that of the hybrid bonding structure 100 and therefore are omitted.

As shown in FIG. 11E, a hybrid bonding structure 500 is formed by bonding the first conductive layer 28a to the second conductive layer 28b. The first conductive layer 28a and the second conductive layer 28b have the same structure. The difference between the hybrid bonding structure 500 and the hybrid bonding structure 100 is that the air gap 26 of the hybrid bonding structure 500 forms a recess 34 within the second dielectric layer 16. A sidewall of the recess 34 is arc-shaped, and a width of the bottom of the recess 34 is larger than a width of the opening of the recess 34. Other elements are the same as that of the hybrid bonding structure 100 and therefore are omitted.

As shown in FIG. 11F, a hybrid bonding structure 600 is formed by bonding the first conductive layer 28a to the third conductive layer 28c. The difference between the hybrid bonding structure 500 and the hybrid bonding structure 600 is that there is no air gap within the third conductive layer 28c of the hybrid bonding structure 600. The structure of the third conductive layer 28c can be found in FIG. 11D, please refer to accompany description in FIG. 11D for reference. In the hybrid bonding structure 600, the first conductive layer 22 of the first conductive structure 28a bonds to the second conductive layer 122 of the third conductive structure 28c. The second dielectric layer 16 of the first conductive structure 28a bonds to the third dielectric layer 116 of the third conductive structure 28c. Other elements are the same as that of the hybrid bonding structure 500 and therefore are omitted.

As shown in FIG. 11G, a hybrid bonding structure 700 is formed by bonding the first conductive layer 28a to the second conductive layer 28b. Unlike the hybrid bonding structure 100, in the hybrid bonding structure 700, the shape of the air gap 26 in the first conductive structure 28a is different from the shape of the air gap 26 in the second conductive structure 28b. Furthermore, there is misalignment occurred in the hybrid bonding structure 700. Therefore, the first conductive layer 22 of the first conductive layer 28a overlaps the air gap 26 of the second conductive structure 28b.

Air gap is specially disposed around a side of a barrier, and the air gap is at the side which is opposed to the conductive layer. In this way, contamination from diffusion of the metal atoms because of contact between the interlayer dielectric and the conductive layer due to misalignment can be prevented. Moreover, because the dielectric constant of the air gap is about 1, by replacing part of the interlayer dielectric with an air gap, the parasitic capacitance can be reduced. Furthermore, comparing to a hybrid bonding structure with an air gap disposed within the conductive layer, the hybrid bonding structure of the present invention sets the air gap at a side of the barrier away from the conductive layer. In this way, the space of the conductive layer will not be occupied by the air gap, and the hybrid bonding structure can have low resistance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A hybrid bonding structure, comprising:
   a first conductive structure, wherein the first conductive structure comprises:
   a first conductive layer;
   a first barrier surrounding and contacting the first conductive layer;
   a first air gap surrounding and contacting the first barrier; and a first dielectric layer surrounding and contacting the first air gap;
an etch stop layer contacting a bottom surface of the first dielectric layer, the first air gap, and the first barrier;
a second conductive structure, wherein the second conductive structure comprises:
a second conductive layer;
a second barrier contacting the second conductive layer; and
a second dielectric layer surrounding the second barrier; wherein the second conductive layer contacts and bonds to the first conductive layer, and the first dielectric layer contacts and bonds to the second dielectric layer.

2. The hybrid bonding structure of claim 1, further comprising a second air gap surrounding and contacting the second barrier.

3. The hybrid bonding structure of claim 1, wherein a depth of the first air gap is smaller than a depth of the first dielectric layer.

4. The hybrid bonding structure of claim 1, wherein a depth of the first air gap is the same as a depth of the first dielectric layer.

5. The hybrid bonding structure of claim 1, wherein the first air gap forms a recess within the first dielectric layer.

6. The hybrid bonding structure of claim 5, wherein a bottom of the recess is arc-shaped.

7. The hybrid bonding structure of claim 5, wherein a bottom of the recess is a horizontal surface.

8. The hybrid bonding structure of claim 1, wherein the first conductive layer comprises Cu, Al, W, Ti, TiN, Ta, Cu/Al or TaN, and the second conductive layer comprises Cu, Al, W, Ti, TiN, Ta, Cu/Al or TaN.

9. The hybrid bonding structure of claim 1, wherein a width of the first air gap is between 0.01 μm and 10 μm, and a width of the second air gap is between 0.01 μm and 10 μm.

10. The hybrid bonding structure of claim 1, wherein a top surface of the first dielectric layer is aligned with a top surface of the first conductive layer.

11. A fabricating method of a hybrid bonding structure, comprising:
performing an air gap fabricating method comprising steps of:
forming a first dielectric layer;
forming an etching stop layer covering the first dielectric layer;
forming a second dielectric layer covering the etching stop layer;
forming a trench within the second dielectric layer and the etching stop layer;
forming a first barrier and a first conductive layer filling in the trench in sequence;
forming a patterned mask covering the second dielectric layer, wherein the first barrier, the first conductive layer and the second dielectric layer which is around the first barrier are exposed through the patterned mask;
performing an etching step to remove the second dielectric layer exposed through the patterned mask to form an air gap surrounding the first barrier; and
removing the patterned mask to form an $N^{th}$ conductive structure, wherein N is a positive integer from 1 to 2.

12. The fabricating method of the hybrid bonding structure of claim 11, further comprising:
repeating the air gap fabricating method to form a first conductive structure and a second conductive structure; and
bonding the first conductive layer of the first conductive structure to the first conductive layer of the second conductive structure, and bonding the second dielectric layer of the first conductive structure to the second dielectric layer of the second conductive structure.

13. The fabricating method of the hybrid bonding structure of claim 11, further comprising:
providing a third conductive structure comprising:
a second conductive layer;
a second barrier surrounding and contacting the second conductive layer; and
a third dielectric layer surrounding and contacting the second barrier;
bonding the first conductive layer of the first conductive structure to the second conductive layer of the third conductive structure, and bonding the second dielectric layer of the first conductive structure to the third dielectric layer of the third conductive structure.

14. The fabricating method of the hybrid bonding structure of claim 11, wherein the etching step comprises a dry etching, a partial dry etching or a wet etching.

15. The fabricating method of the hybrid bonding structure of claim 11, wherein the first conductive layer comprises Cu, Al, W, Ti, TiN, Ta, Cu/Al or TaN.

16. The fabricating method of the hybrid bonding structure of claim 11, wherein a width of the air gap is between 0.01 μm and 10 μm.

17. A fabricating method of a hybrid bonding structure, comprising:
performing an air gap fabricating method to form an $N^{th}$ conductive structure, wherein N is a positive integer from 1 to 2 and the air gap fabricating method comprises steps of:
providing a first dielectric layer;
forming an etching stop layer covering the first dielectric layer;
forming a sacrifice layer covering part of the etching stop layer;
forming a spacer surrounding the sacrifice layer;
forming a second dielectric layer covering the etching stop layer, wherein a top surface of the second dielectric layer is aligned with a top surface of the sacrifice layer;
removing the sacrifice layer and the etching stop layer directly below the sacrifice layer to form a trench;
forming a first barrier and a first conductive layer filling in the trench in sequence; and
removing the spacer to form an air gap surrounding the first barrier.

18. The fabricating method of the hybrid bonding structure of claim 17, further comprising:
repeating the air gap fabricating method to form a first conductive structure and a second conductive structure; and
bonding the first conductive layer of the first conductive structure to the first conductive layer of the second conductive structure, and bonding the second dielectric layer of the first conductive structure to the second dielectric layer of the second conductive structure.

19. The fabricating method of the hybrid bonding structure of claim 17, further comprising:
providing a third conductive structure, comprising:
a second conductive layer;
a second barrier surrounding and contacting the second conductive layer; and
a third dielectric layer surrounding and contacting the second barrier;

bonding the first conductive layer of the first conductive structure to the second conductive layer of the third conductive structure, and bonding the second dielectric layer of the first conductive structure to the third dielectric layer of the third conductive structure.

20. The fabricating method of the hybrid bonding structure of claim 17, wherein a width of the air gap is between 0.01 μm and 10 μm.

\* \* \* \* \*